US012679125B2

(12) United States Patent
Kim

(10) Patent No.: US 12,679,125 B2
(45) Date of Patent: Jul. 14, 2026

(54) METHOD OF PROCESSING SUBSTRATE

(71) Applicant: SEMES CO., LTD., Cheonan-si (KR)

(72) Inventor: Euihwan Kim, Daejeon-si (KR)

(73) Assignee: Semes Co., Ltd., Cheonan-si (KR)

( * ) Notice: Subject to any disclaimer, the term of this patent is extended or adjusted under 35 U.S.C. 154(b) by 189 days.

(21) Appl. No.: 18/773,922

(22) Filed: Jul. 16, 2024

(65) Prior Publication Data

US 2025/0033395 A1      Jan. 30, 2025

(30) Foreign Application Priority Data

Jul. 25, 2023      (KR) ........................ 10-2023-0096534

(51) Int. Cl.
| | |
|---|---|
| *B41J 29/393* | (2006.01) |
| *B41J 2/01* | (2006.01) |
| *B41J 2/11* | (2006.01) |
| *B41J 3/407* | (2006.01) |
| *B41M 3/00* | (2006.01) |
| *B41M 5/00* | (2006.01) |
| *G02F 1/13* | (2006.01) |
| *G02F 1/1335* | (2006.01) |
| *H10P 72/00* | (2026.01) |

(52) U.S. Cl.
CPC .............. *B41J 29/393* (2013.01); *B41J 2/01* (2013.01); *B41J 2/11* (2013.01); *B41J 3/407* (2013.01); *B41M 3/008* (2013.01); *B41M 5/0047* (2013.01); *G02F 1/1303* (2013.01); *B41J 2029/3935* (2013.01); *G02F 1/133516* (2013.01); *H10P 72/0448* (2026.01)

(58) Field of Classification Search
CPC ..... B41J 29/393; B41J 2/01; B41J 2/11; B41J 3/407; B41J 2029/3935; B41M 3/008; B41M 5/0047; G02F 1/1303; G02F 1/133516; H10P 72/0448
See application file for complete search history.

(56) References Cited

U.S. PATENT DOCUMENTS

| | | | | |
|---|---|---|---|---|
| 7,854,488 B2 * | 12/2010 | Yamazaki | .............. | B41J 29/393 |
| | | | | 347/19 |
| 2014/0374375 A1 * | 12/2014 | Zwiers | ................ | B41J 2/16538 |
| | | | | 118/712 |

FOREIGN PATENT DOCUMENTS

| | | | | |
|---|---|---|---|---|
| EP | 2394745 A1 * | 12/2011 | ............ | B41J 2/0456 |
| KR | 101657485 B1 | 9/2016 | | |
| KR | 102363034 B1 | 2/2022 | | |
| KR | 20230023099 A | 2/2023 | | |

* cited by examiner

*Primary Examiner* — Henok D Legesse
(74) *Attorney, Agent, or Firm* — Harness, Dickey & Pierce, P.L.C.

(57) ABSTRACT

In a method of processing a substrate, a test film having a first area and a second area adjacent to the first area is provided. A first jet value is obtained from a first test pattern formed by jetting a chemical solution through a plurality of nozzles onto the first area of the test film. The chemical solution is jetted onto a first substrate based on the first jet value. A second jet value is obtained from a second test pattern formed by jetting the chemical solution through the plurality of nozzles onto the second area of the test film. The chemical solution is jetted onto a second substrate based on the second jet value.

20 Claims, 6 Drawing Sheets

Z DIRECTION

Y DIRECTION

X DIRECTION

F I G. 3
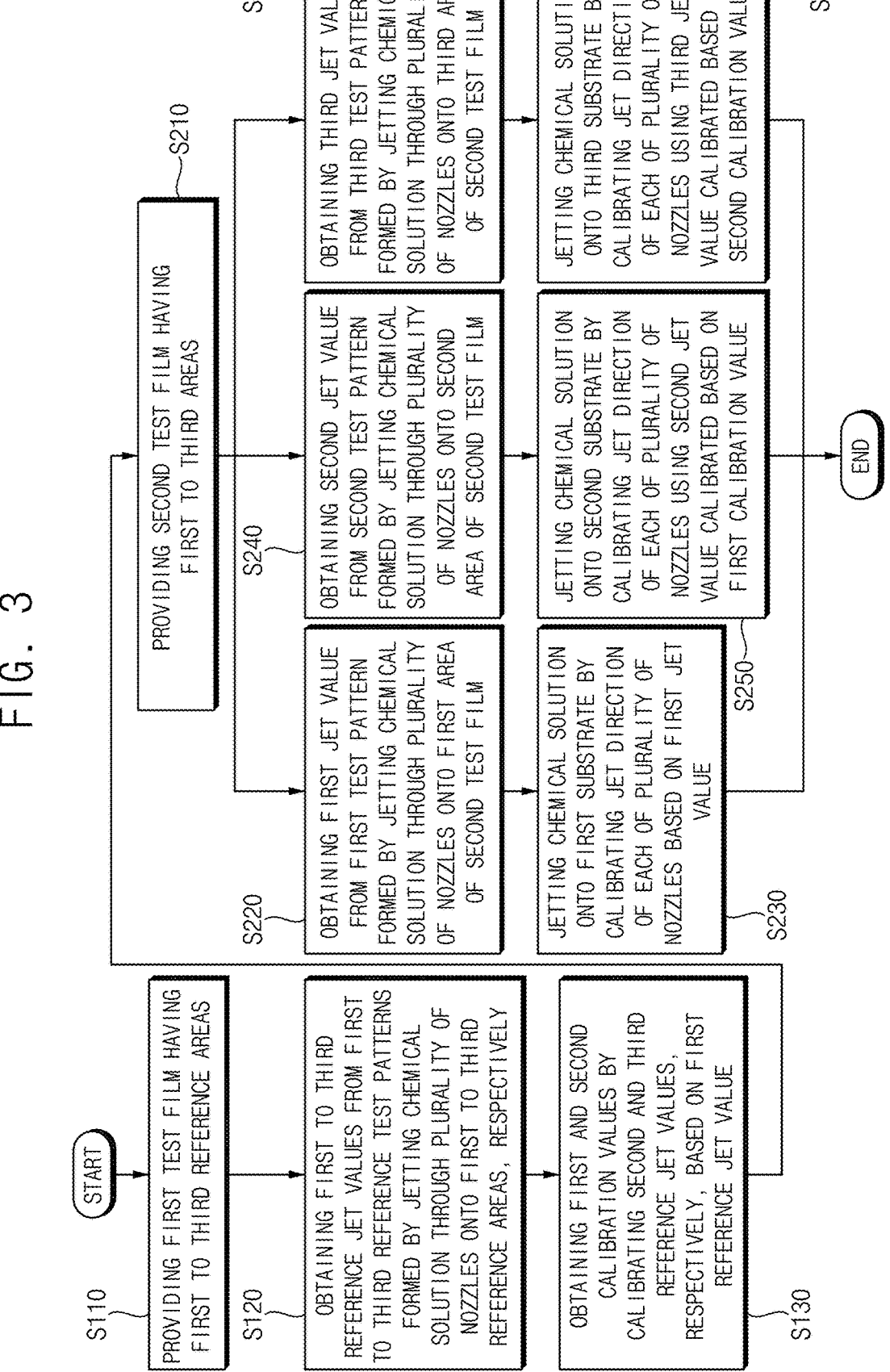

Y DIRECTION

X DIRECTION

Y DIRECTION

X DIRECTION

METHOD OF PROCESSING SUBSTRATE

CROSS-RELATED APPLICATION

This application claims priority under 35 USC § 119 to Korean Patent Application No. 10-2023-0096534, filed on Jul. 25, 2023 in the Korean Intellectual Property Office (KIPO), the contents of which are herein incorporated by reference in their entirety.

BACKGROUND

1. Field

The present invention relates a substrate processing method, and more particularly to a method of processing a substrate to apply a chemical solution on a substrate.

2. Description of the Related Art

In a display inkjet printer apparatus, a plurality of nozzles may be used to jet a chemical solution on a display substrate using an inkjet printing method. Depending on the jetting direction of the plurality of nozzles, a jetting error may occur. The jetting error of the plurality of nozzles can be corrected based on the test pattern formed on a test film. In the case of forming a single test pattern on a single test film, the replacement cycle of the test film may increase, and the production cost of the test film may increase.

SUMMARY

It is an object of the present invention to provide a method of substrate processing capable of forming a plurality of test patterns on a single test film to maximize the efficiency of the test film.

A method of processing a substrate according to an aspect of exemplary embodiments of the present invention to accomplish the object includes providing a test film including a first area and a second area adjacent to the first area; obtaining a first jet value from a first test pattern formed by jetting a chemical solution through a plurality of nozzles onto the first area of the test film; jetting the chemical solution onto a first substrate based on the first jet value; obtaining a second jet value from a second test pattern formed by jetting the chemical solution through the plurality of nozzles onto the second area of the test film; and jetting the chemical solution onto a second substrate based on the second jet value.

In exemplary embodiments, the plurality of nozzles comprises first and second sets of jetting nozzles arranged along first and second lines, respectively, parallel to each other.

In exemplary embodiments, the first and second sets of jetting nozzles jet the chemical solution in a line on each of the first and second areas, respectively.

In exemplary embodiments, each of the first and second jet values is obtained via an area camera or a line scan camera.

In exemplary embodiments, the method further includes providing a reference test film including a first reference area and a second reference area adjacent to the first reference area; obtaining first and second reference jet values from first and second reference test patterns formed by jetting the chemical solution onto the first and second reference areas of the reference test film through the plurality of nozzles, respectively; and obtaining a first calibration value by calibrating the second reference jet value based on the first reference jet value.

In exemplary embodiments, the jetting of the chemical solution onto the second substrate includes jetting the chemical solution onto the second substrate based on the second jet value calibrated based on the first calibration value.

In exemplary embodiments, the test film and the reference test film are the same single film substrate, and wherein the first and second areas and the first and second reference areas are coplanar with each other.

In exemplary embodiments, the first and second reference areas on the reference test film are provided in areas corresponding to the first and second areas on the test film, respectively.

In exemplary embodiments, each of the first and second reference areas has a width within a range of 5 mm to 15 mm.

In exemplary embodiments, the jetting of the chemical solution onto the first substrate includes calibrating a jet direction of each of the plurality of nozzles using the first jet value calibrated based on the first reference jet value to jet the chemical solution; and the jetting of the chemical solution onto the second substrate comprises calibrating the jet direction of each of the plurality of nozzles using the second jet value calibrated based on the first calibration value to jet the chemical solution onto the second substrate.

In exemplary embodiments, the reference test film further includes a third reference area adjacent to the second reference area, and the test film further includes a third area adjacent to the second area.

In exemplary embodiments, the method further includes obtaining a third reference jet value from third reference test patterns formed by jetting the chemical solution through the plurality of nozzles onto the third reference area of the reference test film; and obtaining a second calibration value by calibrating the third reference jet value based on the first reference jet value.

In exemplary embodiments, the method further includes obtaining a third jet value from a third test pattern formed by jetting the chemical solution through the plurality of nozzles on the third area of the test film; and jetting the chemical solution onto a third substrate using the third jet value calibrated based on the second calibration value.

A method of processing a substrate according to another aspect of exemplary embodiments of the present invention to accomplish the object includes obtaining a first jet value from a first test pattern formed by jetting a chemical solution through a plurality of nozzles onto the first area of the test film; jetting the chemical solution onto a first substrate through calibrating a jet direction of the plurality of nozzles based on the first jet value; obtaining a second jet value from a second test pattern formed by jetting the chemical solution through the plurality of nozzles onto a second area adjacent to the first area of the test film; and jetting the chemical solution onto a second substrate through calibrating the jet direction of the plurality of nozzles based on the second jet value.

In exemplary embodiments, the method further includes obtaining first and second reference jet values from first and second reference test patterns formed by jetting the chemical solution onto first and second reference areas of the reference test film through the plurality of nozzles, respectively; and obtaining a first offset value of the first and second reference jet values.

In exemplary embodiments, the jetting of the chemical solution onto the second substrate further includes calibrating the jet direction of the plurality of nozzles based on the second jet value calibrated on a basis of the first offset value.

In exemplary embodiments, the plurality of nozzles includes first and second sets of jetting nozzles arranged along first and second lines, respectively, parallel to each other.

In exemplary embodiments, the first and second sets of jetting nozzles jet the chemical solution in a line on the first and second reference areas and on the first and second areas, respectively.

In exemplary embodiments, each of the first and second areas has a width within a range of 5 mm to 15 mm.

A method of processing a substrate according to still another aspect of exemplary embodiments of the present invention to accomplish the object includes: providing a first test film including first to third reference areas; obtaining first to third reference jet values from first to third reference test patterns formed by jetting a chemical solution through a plurality of nozzles onto the first to third reference areas of the first test film, respectively; calibrating the second and third reference jet values based on the first reference jet value to obtain first and second calibration values, respectively; providing a second test film including first to third areas; obtaining a first jet value from a first test pattern formed by jetting the chemical solution through the plurality of nozzles onto the first area of the second test film; jetting the chemical solution onto a first substrate through calibrating a jet direction of each of the plurality of nozzles using the first jet value calibrated based on the first reference jet value; obtaining a second jet value from a second test pattern formed by jetting the chemical solution through the plurality of nozzles onto the second area of the second test film; jetting the chemical solution onto a second substrate through calibrating the jet direction of each of the plurality of nozzles using the second jet value calibrated based on the first calibration value; obtaining a third jet value from a third test pattern formed by jetting the chemical solution through the plurality of nozzles onto the third area of the second test film; and jetting the chemical solution onto a third substrate through calibrating the jet direction of each of the plurality of nozzles using the third jet value calibrated based on the second calibration value.

In the method of processing the substrate according to exemplary embodiments, a test film having a first area and a second area adjacent to the first area can be provided. A first jet value can be obtained from a first test pattern formed by jetting the chemical solution through a plurality of nozzles onto the first area of the test film. The first jet value can be used to jet the chemical solution onto a first substrate. A second jet value can be obtained from a second test pattern formed by jetting the chemical solution through the plurality of nozzles onto the second area of the test film. And the second jet value can be used to jet the chemical solution onto a second substrate.

Accordingly, the test film may have different first and second areas. The chemical solution may be jetted onto the first substrate based on the first jet value obtained from the chemical solution jetted onto the first area of the test film. Also, the chemical solution may be jetted onto the second substrate based on the second jet value obtained from the chemical solution jetted onto the second area of the test film. In the process of jetting the chemical solution onto different the first and second substrates, the first and second jet values can be obtained from the first and second areas of the test film, respectively.

Since the first and second jet values are obtained from the first and second areas, respectively, the replacement cycle of the test film can be reduced, and the efficiency of the test film can be maximized to reduce production costs.

Furthermore, since the test film is divided into the first and second areas when it is used, errors may occur in the first and second jet values obtained from the first and second areas, respectively. To minimize the error, however, first and second reference jet values may be obtained from first and second reference areas of the reference test film, respectively. A first calibration value may be obtained by calibrating the second reference jet value based on the first reference jet value.

The amount of the chemical solution jetted onto the first substrate can be determined based on the first jet value calibrated on the basis of the first reference jet value. The amount of the chemical solution jetted onto the second substrate can be determined based on the second jet value calibrated on the basis of the first calibration value. Since both the first jet value and the first calibration value are calibrated based on the first reference jet value, the error in the first and second jet values obtained from different the first and second areas, respectively, can be minimized.

The effects of the present invention are not limited to the above-mentioned effects, and may be extended in various ways without departing from the spirit and scope of the present invention.

BRIEF DESCRIPTION OF THE DRAWINGS

FIG. 2 is a perspective view illustrating a chemical solution jetting unit of the substrate processing apparatus shown in FIG. 1, in accordance with exemplary embodiments.

FIG. 3 is a flow diagram illustrating a method of processing a substrate, according to exemplary embodiments.

DESCRIPTION OF EMBODIMENTS

Hereinafter, preferred embodiments of the present invention will be described in more detail with reference to the accompanying drawings.

With respect to the embodiments of the invention disclosed herein, certain structural and functional descriptions are exemplified for the purpose of illustrating embodiments of the invention only, and embodiments of the invention may be practiced in various forms and should not be construed as limiting to the embodiments described herein.

The terminology used in the present invention is used to describe particular embodiments only and is not intended to limit the invention. Expressions in the singular include the plural unless the context clearly indicates otherwise. In this application, the terms 'comprising' or 'having' and the like are intended to designate the presence of the features, numbers, steps, actions, elements, parts, or combinations thereof described herein, and are not to be understood as precluding the possibility of the presence or addition of one or more other features, numbers, steps, actions, elements, parts, or combinations thereof.

In each of the drawings of the present invention, the dimensions of the structures are shown to scale for the purpose of clarity of the invention. In the present invention, terms such as first, second, and the like may be used to describe various elements, but the elements are not to be limited by such terms. These terms are used only for the purpose of distinguishing one element from another.

Figure 1:
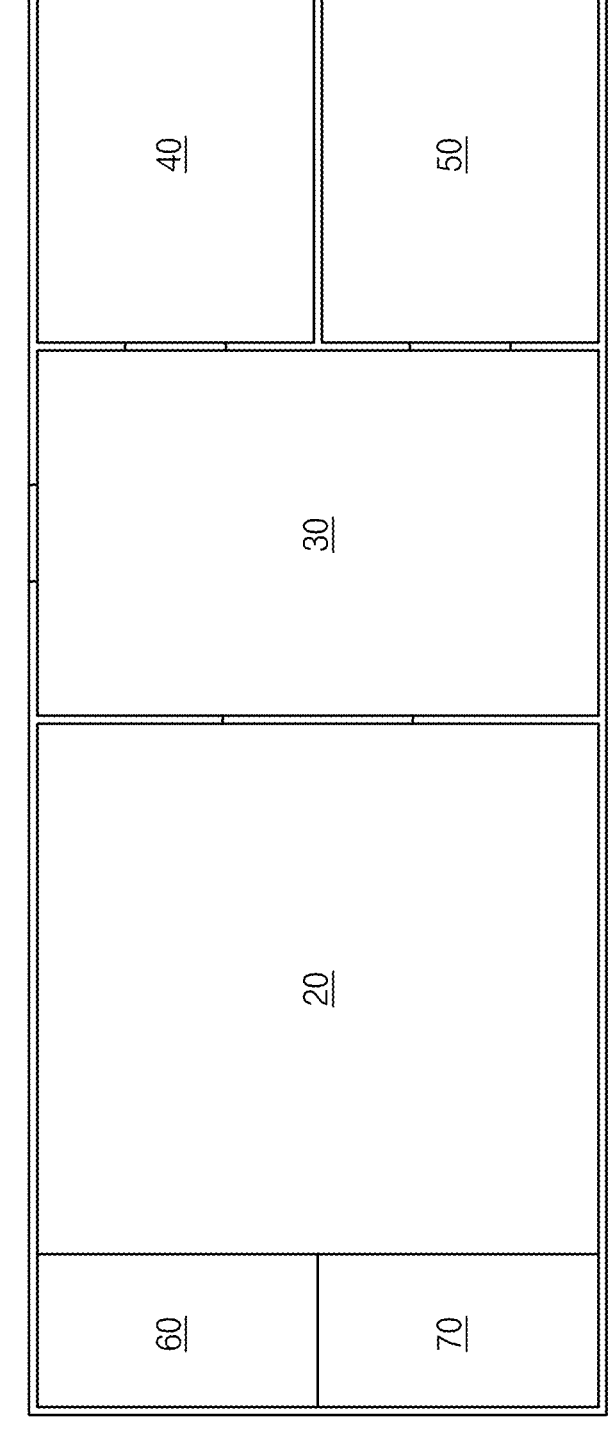
FIG. 1 is a diagram illustrating a substrate processing apparatus according to exemplary embodiments.

FIG. 1 illustrates a substrate processing apparatus according to exemplary embodiments.

Referring to FIG. 1, a substrate processing apparatus 10 may include a chemical solution jet unit 20, a substrate transfer unit 30, a loading unit 40, an unloading unit 50, a chemical solution supply unit 60, and a main control unit 70. The chemical solution jet unit 20 and the substrate transfer unit 30 may be disposed adjacent to each other. The chemical solution supply unit 60 and the main control unit 70 may be disposed adjacent to the chemical solution jet unit 20. The loading unit 40 and the unloading unit 50 may be disposed adjacent to the substrate transfer unit 30.

The substrate processing apparatus 10 may be used to manufacture a flat panel display (FPD) or the like. The substrate processing apparatus 10 may apply a chemical solution on a substrate using an inkjet method. For example, the substrate may include an array substrate of a liquid crystal display (LCD) device, a color filter substrate, or the like.

The chemical solution may include an orienting solution, a liquid crystal, an ink, or the like. The ink may include red (R), green (G), or blue (B) inks having pigment particles mixed in a solvent. The orienting solution may be applied to the front surface of the array substrate and the color filter substrate. The orienting solution may comprise polyimide (PI). The ink may be applied to an interior area of a black matrix (BM) arranged in a grid on the color filter substrate.

The substrate may be loaded into the loading unit 40. The substrate transfer unit 30 may transfer the substrate received from the loading unit 40 to the chemical solution jet unit 20. The chemical solution jet unit 20 may receive the chemical solution from the chemical solution supply unit 60, and may jet the chemical solution onto the substrate using the inkjet method. When the jet of the chemical solution is completed, the substrate transfer unit 30 may transfer the substrate from the chemical solution jet unit 20 to the unloading unit 50. The substrate may be unloaded from the unloading unit 50. The main control unit 70 may control operations of the chemical solution jet unit 20, the substrate transfer unit 30, the loading unit 40, the unloading unit 50, and the chemical solution supply unit 60. The main control unit 70 may include a processor and a memory device capable of executing a computer program implementing the relevant logic of the substrate processing method described herein.

In the following, the chemical solution jet unit 20 will be described.

Figure 2:
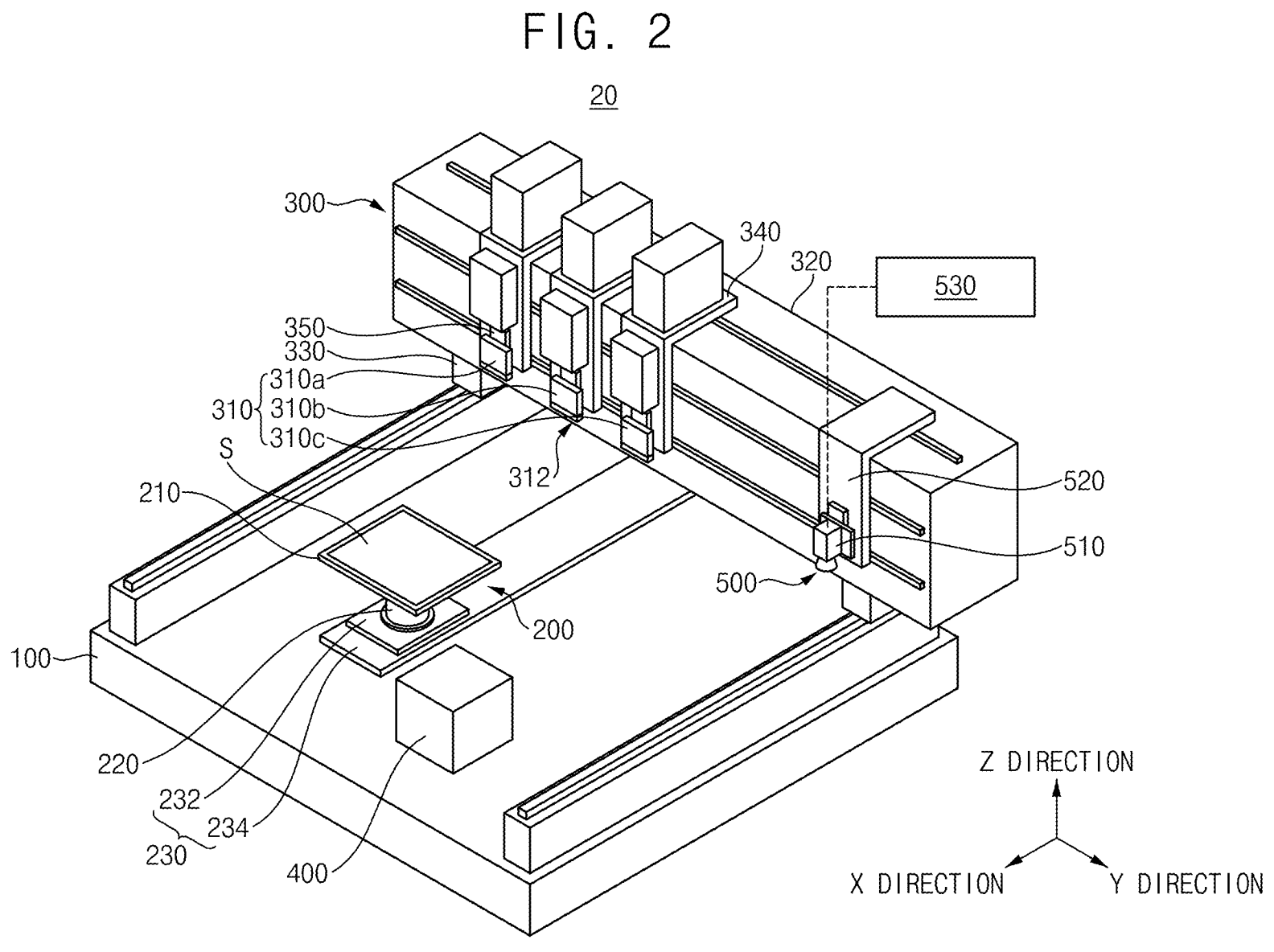

FIG. 2 is a perspective view illustrating the chemical solution jetting unit of the substrate processing apparatus shown in FIG. 1, in accordance with exemplary embodiments.

Referring to FIGS. 1 and 2, the chemical solution jet unit 20 may include a base plate 100, a substrate support 200, a head assembly 300, a nozzle cleaner 400, and a scanner 500.

The substrate support 200 may be provided on a top surface of the base plate 100. The base plate 100 may have a hexahedral plate shape.

The substrate support 200 may include a substrate stage 210 on which a substrate S is placed. The substrate stage 210 may have a receiving surface for placing the substrate S. A lower portion of the substrate stage 210 may be provided with a stage rotator 220. The stage rotator 220 may include a rotary motor. The stage rotator 220 may rotate the substrate stage 210 about a vertical axis. When the substrate stage 210 is rotated by the stage rotator 220, the substrate S can be rotated in the same direction as the substrate stage 210.

The substrate S may include a display substrate, a film substrate, or a test film. The test film may have the same shape as the actual substrate. The top surface of the test film may have the same material as the top surface of the real substrate. For example, the top surface of the test film may be chemically processed to have the same material as the actual substrate.

The substrate stage 210 and the stage rotator 220 can be moved in a first horizontal direction (X direction) by a stage actuator 230. The stage actuator 230 may include a slider 232 and a guide 234. The stage rotator 220 may be provided on top of the slider 232. The guide 234 may extend in the first horizontal direction (X direction) along a top surface of the base plate 100. The slider 232 may include a linear motor, and may be moved along the guide 234 in the first horizontal direction (X direction) via the linear motor.

Herein, the direction in which the guide 234 extends will be referred to as the first horizontal direction (X direction), a horizontal direction orthogonal to the first horizontal direction will be referred to as a second horizontal direction (Y direction), and a direction orthogonal to the first and second horizontal directions will be referred to as a vertical direction (Z direction).

The head assembly 300 may include at least one inkjet head 310 and a head driver for moving the inkjet head 310. The head driver may include a gantry 320. The gantry 320 may be provided along a path along which the substrate stage 210 travels. The gantry 320 may be spaced upwardly from a top surface of the base plate 100. The gantry 320 may be configured to have a its longitudinal direction parallel to the second horizontal direction (Y direction).

The head actuator may include a second horizontal actuator 340 and a vertical actuator 350. The inkjet head 310 may be installed on the gantry 320 by the second horizontal actuator 340 and the vertical actuator 350. The inkjet head 310 can be moved in the second horizontal direction (Y direction), which is a lengthwise direction of the gantry 320, by the second horizontal actuator 340, and in the vertical direction (Z direction) by the vertical actuator 350.

The head actuator may further include a first horizontal actuator 330. The gantry 320 may be moved in the first horizontal direction (X direction) by the first horizontal actuator 330. The inkjet head 310 can be moved in the first horizontal direction (X direction), the second horizontal direction (Y direction), and the vertical direction (Z direction) by the gantry 320, the first horizontal actuator 330, the second horizontal actuator 340, and the vertical actuator 350. The inkjet head 310 may include a plurality of nozzles 312 that jet a chemical solution onto the substrate S. For example, the inkjet head 310 may have three inkjet heads. The three inkjet heads 310a, 310b, and 310c may be disposed in a row along the second horizontal direction (Y direction). Each of the inkjet heads 310a, 310b, and 310c may have a piezoelectric element. The piezoelectric elements may independently regulate when to jet, and how much to jet. The second horizontal actuator 340 and the vertical actuator 350 may be provided to correspond to each of the inkjet heads 310a, 310b, and 310c. The second horizontal actuator 340 and the vertical actuator 350 may move each of the inkjet heads 310a, 310b, and 310c separately. The nozzle cleaner 400 can clean the inkjet head 310. The nozzle cleaner 400 can provide negative pressure to a plurality of nozzles of the inkjet head 310, and can remove any residual chemical solution at jet ends of the plurality of nozzles. For example, the nozzle cleaner 400 may include a suction nozzle.

The scanner 500 may scan impingement points of the chemical solution jetted from the inkjet head 310 onto the test film. The scanner 500 may include a camera 510, a camera actuator 520, and a controller 530.

The controller 530 may control the head assembly 300 such that a test pattern is formed on the upper surface of the test film for performing a test of impingement points of the chemical solution. The test pattern may comprise dots of the chemical solution. The controller 530 may include a processor and a memory device capable of executing a computer program to perform the control logic described herein.

The test pattern may be a pattern that is indicative of the chemical solution application characteristics of the head assembly 300. For example, the test pattern may be a pattern having dots arranged in a path of travel of the inkjet head 310 during a process for applying the chemical solution onto the test film.

The camera 510 may take an image having the test pattern formed on the test film by the head assembly 300. The camera 510 may include an area camera or a line scan camera. The camera 510 may be movable on the gantry 320 in the second horizontal direction (Y direction) by the camera actuator 520.

The camera actuator 520 may include a first actuator for moving the camera 510 in the second horizontal direction (Y direction), and a second actuator for moving the camera 510 in the vertical direction (Z direction). The camera 510 may be configured to move in the second horizontal direction (Y direction) and the vertical direction (Z direction) on the gantry 320 by the first and second actuators. Alternatively, the camera actuator 520 may move the camera 510 independently of the inkjet head 310.

The controller 530 may obtain position coordinates for the dots comprising the test pattern from the image taken by the camera 510. The controller 530 may compare the position coordinates to a preset reference coordinate. The controller 530 may compensate for the jet position of the chemical solution by comparing the position coordinates with the preset reference coordinates. That is, if the controller 530 compares the position coordinates with the preset reference coordinates and a difference occurs, the controller 530 may determine that the impingement point of the chemical solution is abnormal, and may calculate a correction amount of the jet position of the chemical solution based on the difference.

In the following, a substrate processing method using the substrate processing apparatus will be described.

Figure 4:
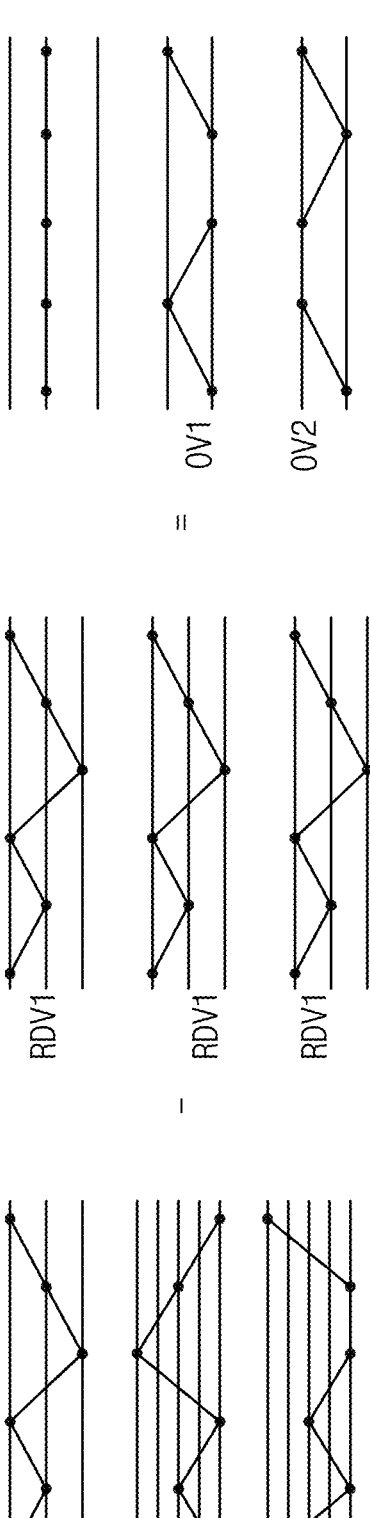
FIG. 4 illustrates a process of calibrating second and third reference jet values against a first reference jet value to obtain first and second calibration values, respectively.

FIG. 3 is a flow diagram illustrating the substrate processing method according to exemplary embodiments. FIG. 4 is a diagram illustrating a process for obtaining first and second calibration values by calibrating second and third reference jet values, respectively, based on a first reference jet value.

The substrate processing method according to exemplary embodiments may be implemented as a computer program reflecting the substrate processing logic described herein. The substrate processing method may be performed by the processor of the main control unit 70 executing the computer program.

Referring to FIGS. 3 and 4, a first test film TS1 having first to third reference areas RA1, RA2, and RA3 may be provided (S110).

In exemplary embodiments, the substrate processing method may be to jet the chemical solution onto the substrate using an inkjet printing apparatus. The inkjet printing apparatus may jet the chemical solution onto the substrate via a plurality of nozzles. For example, the substrate may include a display substrate or a film substrate.

The first test film (reference test film) TS1 may be a substrate for testing the reliability of the inkjet printing apparatus. The inkjet printing apparatus may jet the chemical solution onto the first test film TS1 through the plurality of nozzles. The jet direction of each of the plurality of nozzles may be determined from the chemical solution jetted onto the first test film TS1. The jet direction of each of the plurality of nozzles may vary during the repeated process.

The first test film TS1 may have a plurality of divided reference areas. The first test film TS1 may have first and second reference areas RA1, and RA2 that are adjacent to each other. The first test film TS1 may further have the third reference area RA3 adjacent to the second reference area RA2.

The substrate processing method may perform a plurality of tests by dividing the first test film TS1 into the plurality of reference areas. The substrate processing method may jet the chemical solution onto the first to third reference areas RA1, RA2, and RA3 of the first test film TS1 to determine the impingement points. The impingement points may be used to calibrate the jet direction of each of the plurality of nozzles.

Since the substrate processing method performs the tests by dividing the first test film TS1 into the plurality of reference areas, the efficiency of the first test film TS1 can be maximized, thereby reducing production costs. For example, the first test film TS1 may include a nozzle jetting inspection film (NJI film).

Each of the first to third reference areas RA1, RA2, and RA3 may have a first width W1. The first width W1 may be the minimum width over which the first test film TS1 can be divided into the plurality of reference areas to perform the test. The first width W1 of each of the first to third reference areas RA1, RA2, and RA3 may be within a range of 5 mm to 15 mm.

Subsequently, first to third reference jet values (or, reference discharge values) RDV1, RDV2, and RDV3 may be obtained from first to third reference test patterns RTP1, RTP2, and RTP3 formed by jetting the chemical solution through the plurality of nozzles onto the first to third reference areas RA1, RA2, and RA3 of the first test film TS1, respectively (S120).

In exemplary embodiments, the chemical solution may be jetted onto the first to third reference areas RA1, RA2, and RA3 of the first test film TS1 to form the first to third reference test patterns RTP1, RTP2, and RTP3, respectively. The first to third reference test patterns RTP1, RTP2, and RTP3 may have the impingement points of the chemical solution jetted through the plurality of nozzles.

The first reference test pattern RTP1 may be a test pattern that is referred to in order to keep the jet direction of each of the plurality of nozzles constant during the repeated process. As will be described later, the first reference test pattern RTP1 may be the reference for the first to third test patterns TP1, TP2, and TP3 of a second test film TS2 used to jet the chemical solution onto the first and second substrates.

The first to third reference jet values RDV1, RDV2, and RDV3 may be obtained by calculating coordinates from the impingement points of each of the first to third reference test patterns RTP1, RTP2, and RTP3. The first to third reference jet values RDV1, RDV2, and RDV3 may have errors caused by differences in the location, environment, etc. of the first to third reference areas RA1, RA2, and RA3. As will be described later, the first to third reference jet values RDV1, RDV2, and RDV3 may be reference coordinate values for compensating for the above errors caused by repeated printing processes.

Each of the first to third reference test patterns RTP1, RTP2, and RTP3 may be scanned via the area camera or the line scan camera. The first to third reference test patterns RTP1, RTP2, and RTP3 may be acquired by scanning the first to third reference areas RA1, RA2, and RA3, respectively, in their entirety through the area camera. The first to third reference test patterns RTP1, RTP2, and RTP3 may be acquired by the line scan camera moving over the first to third reference areas RA1, RA2, and RA3.

For example, printing processes for different plurality of display substrates may be performed in between the processes of jetting the chemical solution onto the first to third reference areas RA1, RA2, and RA3 of the first test film TS1.

Then, first and second calibration values OV1, and OV2 may be obtained by calibrating the second and third reference jet values RDV2, and RDV3, respectively, based on the first reference jet value RDV1 (S130).

In exemplary embodiments, the first calibration value (first offset value) OV1 may be obtained by calibrating the second reference jet value RDV2 based on the first reference jet value RDV1. The first calibration value OV1 may be the difference between the first reference jet value RDV1 and the second reference jet value RDV2. The first calibration value OV1 may be an offset value that occurs between the first reference jet value RDV1 and the second reference jet value RDV2. The first calibration value OV1 may be an offset value to compensate for the error between the first reference jet value RDV1 obtained from the first reference area RA1 and the second reference jet value RDV2 obtained from the second reference area RA2.

The second calibration value (second offset value) OV2 may be obtained by calibrating the third reference jet value RDV3 based on the first reference jet value RDV1. The second calibration value OV2 may be the difference between the first reference jet value RDV1 and the third reference jet value RDV3. The second calibration value OV2 may be an offset value between the first reference jet value RDV1 and the third reference jet value RDV3. The second calibration value OV2 may be an offset value to compensate for the error between the first reference jet value RDV1 obtained from the first reference area RA1 and the third reference jet value RDV3 obtained from the third reference area RA3.

Figure 5:
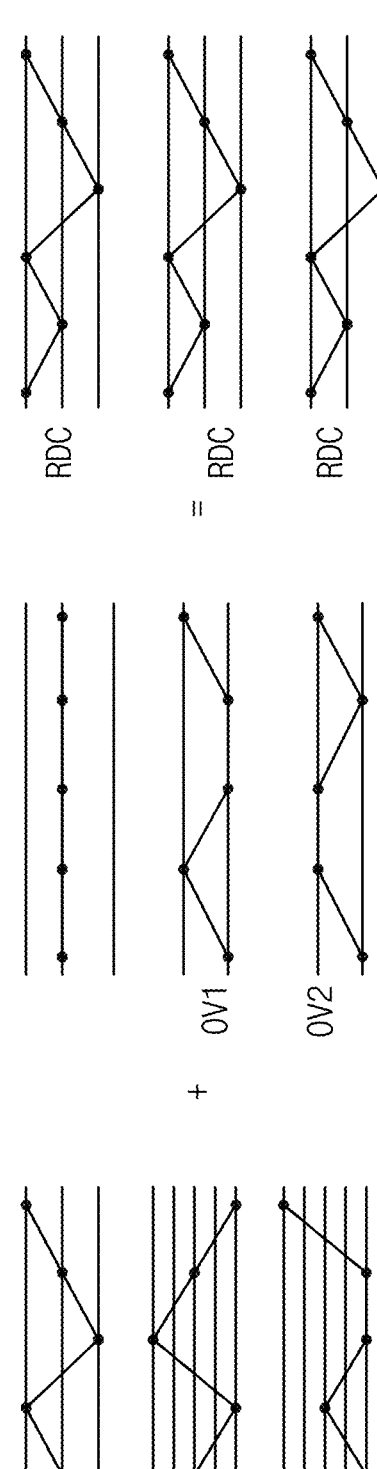
FIG. 5 illustrates a process of calibrating first to third jet values based on the first reference jet value and the first and second calibration values.

FIG. 5 is a diagram illustrating the process of calibrating the first to third jet values based on the first reference jet value and the first and second calibration values.

Referring now to FIGS. 3 to 5, the second test film TS2 having first to third areas A1, A2, and A3 may be provided (S210).

In exemplary embodiments, the jet direction of each of the plurality of nozzles may be verified by the jet of the chemical solution onto the second test film TS2. The jet direction of each of the plurality of nozzles may vary over the course of a repeated process.

The second test film TS2 may have a plurality of segmented areas. The second test film TS2 may have first and second areas A1, and A2 that are adjacent to each other. The first test film TS1 may further have a third area A3 adjacent to the second area A2.

The first to third areas A1, A2, and A3 of the second test film TS2 may be areas corresponding to the first to third reference areas RA1, RA2, and RA3 of the first test film TS1, respectively. The first test film TS1 and the second test film TS2 may be the same type of substrate for testing the reliability of the inkjet printing apparatus.

In contrast, the second test film TS2 may be a single film substrate identical to the first test film TS1. In this case, the first and second areas A1, and A2 of the second test film TS2 may be in the same plane as the first and second reference areas RA1, and RA2 of the first test film TS1.

The test film and the reference test film are the same single film substrate, and the first and second areas and the first and second reference areas RA1, and RA2 may be coplanar with each other.

The substrate processing method may include dividing the second test film TS2 into a plurality of areas to perform a plurality of tests. The substrate processing method may determine the impingement points by jetting the chemical solution onto the first to third areas A1, A2, and A3 of the second test film TS2. The impingement points may be used to calibrate the jet direction of each of the plurality of nozzles.

Since the substrate processing method partitions the second test film TS2 into a plurality of areas to perform the tests, the efficiency of the second test film TS2 can be maximized, thereby reducing production costs. For example, the second test film TS2 may include a nozzle jetting inspection film (NJI film).

Each of the first to third areas A1, A2, A3 may have a second width W2. The second width W2 may be a minimum width that allows the second test film TS2 to be divided into the plurality of areas to perform the test. The second width W2 of each of the first to third areas A1, A2, and A3 may be within a range of 5 mm to 15 mm.

Subsequently, a first jet value DV1 can be obtained from the first test pattern RP1 formed by jetting the chemical solution through the plurality of nozzles onto the first area A1 of the second test film TS2 (S220), and the chemical solution may be jetted onto the first substrate by calibrating the jet direction of each of the plurality of nozzles based on the first jet value DV1 (S230).

In exemplary embodiments, a first test pattern TP1 may be formed by jetting the chemical solution onto the first area A1 of the second test film TS2. The first test pattern TP1 may have the impingement points of the chemical solution jetted through the plurality of nozzles.

The first test pattern TP1 may be scanned via the area camera or the line scan camera. The first jet value DV1 may be obtained by calculating coordinates from the impingement points of the first test pattern TP1. The first test pattern TP1 may be a test pattern corresponding to the first reference test pattern RTP1.

In exemplary embodiments, the first substrate may include a display substrate or a film substrate. Since the substrate processing method jets the chemical solution onto the first substrate based on the first jet value DV1, the jet angle of the plurality of nozzles may be kept constant.

The first jet value DV1 may be calibrated based on the first reference jet value RDV1. The first jet value DV1 may have a reference jet coordinate RDC calibrated based on the first reference jet value RDV1.

Alternatively, since the first area A1 of the first test film TS1 and a second area A2 of the second test film TS2 correspond to each other, the first jet value DV1 may have the same pattern as the first reference jet value RDV1. Since the first jet value DV1 has the same pattern as the first reference jet value RDV1, the first jet value DV1 may be used to jet the chemical solution onto the first substrate without calibration.

Next, a second jet value may be obtained from a second test pattern TP2 formed by jetting the chemical solution through the plurality of nozzles onto the second area A2 of the second test film TS2 (S240).

In exemplary embodiments, the second test pattern TP2 may be formed by jetting the chemical solution onto the second area A2 of the second test film TS2. The second test pattern TP2 may have the impingement points of the chemical solution jetted through the plurality of nozzles.

The second test pattern TP2 may be scanned via the area camera or the line scan camera. The second jet value DV2 may be obtained by calculating coordinates from the impingement points of the second test pattern TP2. The second test pattern TP2 may be a test pattern corresponding to the second reference test pattern RTP2.

In exemplary embodiments, the second substrate may include the display substrate or the film substrate. The first and second substrates may include the same type of display substrate.

Subsequently, the chemical solution may be jetted onto the second substrate by calibrating the jet direction of each of the plurality of nozzles using the second jet value DV2 calibrated based on the first calibration value OV1 (S250).

In exemplary embodiments, the second jet value DV2 may be calibrated based on the first calibration value OV1. Because the second jet value DV2 is obtained from the second test pattern TP2 corresponding to the second reference test pattern DTP2 of the second reference jet value RDV2, the second jet value DV2 may correspond to the second reference jet value RDV2.

Since the first calibration value OV1 is obtained by calibrating the second reference jet value RDV2 based on the first reference jet value RDV1, the second jet value DV2 can be calibrated based on the first reference jet value RDV1. Thus, the second jet value DV2 may have the same reference jet coordinate RDC as the first jet value DV1 because it is calibrated based on the first reference jet value RDV1.

Since the first and second jet values DV1, and DV2 have the same reference jet coordinate RDC, the error of the jet angles of the plurality of nozzles between the first and second areas A1, A2 of the second test film TS2 can be minimized. According to the substrate processing method, the chemical solution is jetted onto the first substrate based on the reference jet coordinates RDC, and thus the jet angles of the plurality of nozzles may be kept constant.

Subsequently, a third jet value DV3 may be obtained from a third test pattern TP3 formed by jetting the chemical solution through the plurality of nozzles on a third area A3 of the second test film TS2 (S260), and the third jet value DV3 calibrated based on the second calibration value OV2 may be used to calibrate the jet direction of each of the plurality of nozzles to jet the chemical solution on a third substrate (S270).

In exemplary embodiments, a third test pattern TP3 may be formed by jetting the chemical solution onto a third area A3 of the second test film TS2. The third test pattern TP3 may be scanned via the area camera or the line scan camera. A third jet value DV3 may be obtained by calculating coordinates from the impingement points of the third test pattern TP3.

In exemplary embodiments, the third substrate may include the display substrate or the film substrate. The first to third substrates may include the same type of display substrate as each other.

In exemplary embodiments, the third jet value DV3 may be calibrated based on the second calibration value OV2. Because the third jet value DV3 is obtained from the third test pattern TP3 corresponding to the third reference test pattern RTP3 of the third reference jet value RDV3, the third jet value DV3 may correspond to the third reference jet value RDV3.

Since the second calibration value OV2 is obtained by calibrating the third reference jet value RDV3 based on the first reference jet value RDV1, the third jet value DV3 may be calibrated based on the first reference jet value RDV1. Thus, the third jet value DV3 may have the same reference jet coordinates RDC as the first and second jet values DV1, DV2 because the third jet value DV3 is calibrated based on the first reference jet value RDV1.

Since the first to third jet values DV1, DV2, DV3 have the same reference jet coordinates RDC, the error in the jet angles of the plurality of nozzles between the first to third areas A1, A2, A3 of the second test film TS2 may be minimized. Thus, in the process of utilizing the second test film TS2 divided into the first to third areas A1, A2, and A3, the reference jet coordinates RDC may be used to minimize the error in the impingement points of the chemical solution jetted from the plurality of nozzles.

Figure 6A:
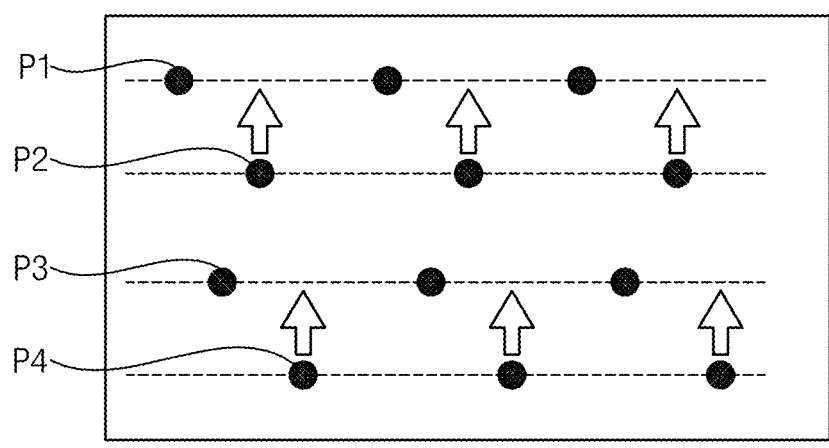
FIGS. 6A and 6B are diagrams illustrating a process of forming a test pattern by jetting a chemical solution with a plurality of nozzles.
Figure 6A:
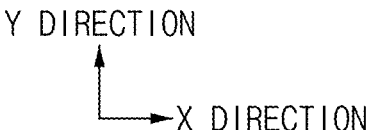
Figure 6B:
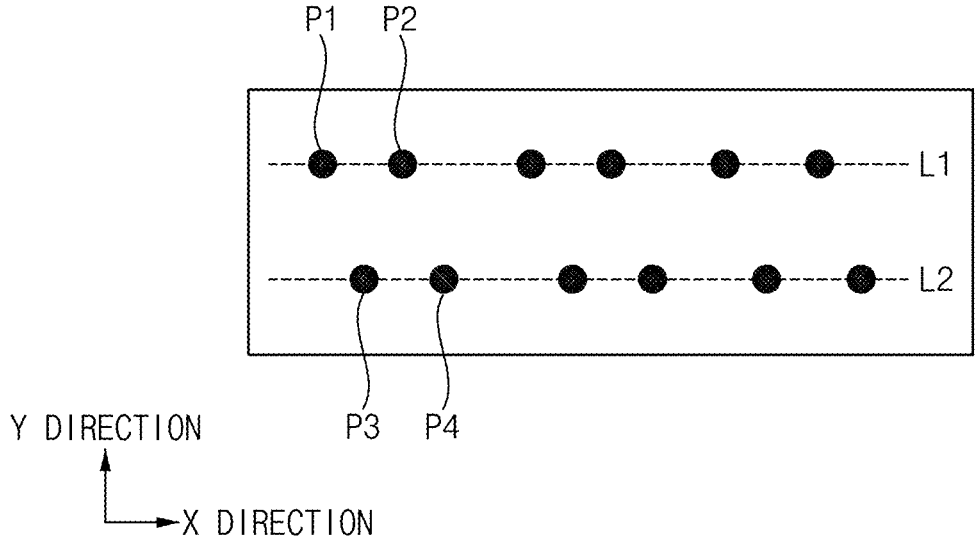

FIGS. 6A and 6B illustrate a process of forming a test pattern by jetting the chemical solution with a plurality of nozzles.

Referring to FIGS. 6A and 6B, the plurality of nozzles may include first to fourth sets of jetting nozzles arranged along first to fourth rows, respectively, parallel to each other.

In exemplary embodiments, each of the first to fourth sets of jetting nozzles may include a plurality of jetting nozzles. As shown in FIG. 6A, the first to fourth sets of jetting nozzles may jet the chemical solution to form the first to fourth sets of impingement points P1, P2, P3, and P4, respectively.

For example, the first to fourth sets of impingement points P1, P2, P3, and P4 may be formed on four separate lines parallel to each other in the first horizontal direction (X direction). Each of the first to fourth sets of impingement points P1, P2, P3, and P4 may be arranged staggered from each other in the second horizontal direction (Y direction) orthogonal to the first horizontal direction (X direction). Thus, the first to fourth sets of impingement points P1, P2, P3, and P4 may not be on the same line in the second horizontal direction (Y direction), that is, may not overlap each other in the second horizontal direction (Y direction).

As shown in FIG. 6B, the first to fourth sets of jetting nozzles may jet the chemical solution onto the first and second reference areas RA1, and RA2 and the first and second areas A1, and A2, respectively.

For example, the first jetting nozzles may form first impingement points P1 along the first line L1 and then the second jetting nozzles may form second impingement points P2 along the first line L1. Since the first and second sets of impingement points P1, and P2 are arranged staggered from each other in the second horizontal direction (Y direction), the first and second sets of impingement points P1, and P2 may not overlap each other on the first line L1.

Subsequently, the third jetting nozzles may form the third impingement points P3 on the second line L2, then the fourth jetting nozzles may form the fourth impingement points P4 on the second line L2. Since the third and fourth sets of impingement points P3, and P4 are arranged staggered from each other in the second horizontal direction (Y direction), the third and fourth sets of impingement points P3, and P4 may not overlap each other on the second line L2. Since each of the first to fourth sets of jetting nozzles form the impingement points along the same line, the first width W1 of each of the first and second reference areas RA1, and RA2 of the first test film TS1 may be reduced, and the second width W2 of each of the first and second areas A1, and A2 of the second test film TS2 may be also reduced. The space utilization of the first and second test films TS1, and TS2 may be increased because the first width W1 and the second width W2 are reduced.

As described above, the second test film TS2 may have different first and second areas A1, and A2. The chemical solution may be jetted onto the first substrate based on the first jet value DV1 obtained from the chemical solution jetted onto the first area A1 of the second test film TS2. The chemical solution may be jetted onto the second substrate based on the second jet value DV2 obtained from the chemical solution jetted onto the second area A2 of the second test film TS2. In the process of jetting the chemical solution onto the different first and second substrates, the first and second jet values DV1, and DV2 may be obtained from the first and second areas A1, and A2 of the second test film TS2, respectively.

Since the first and second jet values DV1, and DV2 are obtained from the first and second areas A1, and A2, respectively, the replacement cycle of the second test film TS2 may be reduced, and the efficiency of the second test film TS2 may be maximized to reduce production costs.

Furthermore, since the second test film TS2 is divided into first and second areas A1, A2 when using it, errors may occur in the first and second jet values DV1, and DV2 obtained from the first and second areas A1, and A2, respectively. The first and second reference jet values RDV1, and RDV2 may be obtained from the first and second reference areas RA1, and RA2 of the first test film TS1, respectively. The first calibration value OV1 may be obtained by calibrating the second reference jet value RDV2 based on the first reference jet value RDV1.

The amount of the chemical solution jetted onto the first substrate may be determined based on the first jet value DV1 calibrated based on the first reference jet value RDV1. The amount of the chemical solution jetted onto the second substrate may be determined based on the second jetting value DV2 calibrated based on the first calibration value OV1. Since both the first jet value DV1 and the first calibration value OV1 are calibrated based on the first reference jet value RDV1, the error in the first and second jet values DV1, and DV2 obtained from the different first and second areas A1, and A2, respectively, may be minimized.

While the above has been described with reference to embodiments of the present invention, it will be understood that various modifications and changes can be made to the present invention by those skilled in the art without departing from the spirit and scope of the invention as recited in the following patent claims.

What is claimed is:

1. A method of processing a substrate, comprising:
providing a test film including a first area and a second area adjacent to the first area;
obtaining a first jet value from a first test pattern formed by jetting a chemical solution through a plurality of nozzles onto the first area of the test film;
jetting the chemical solution onto a first substrate based on the first jet value;
obtaining a second jet value from a second test pattern formed by jetting the chemical solution through the plurality of nozzles onto the second area of the test film; and
jetting the chemical solution onto a second substrate based on the second jet value.

2. The method of claim 1, wherein the plurality of nozzles comprises first and second sets of jetting nozzles arranged along first and second lines, respectively, parallel to each other.

3. The method of claim 2, wherein the first and second sets of jetting nozzles jet the chemical solution in a line on each of the first and second areas, respectively.

4. The method of claim 1, wherein each of the first and second jet values is obtained via an area camera or a line scan camera.

5. The method of claim 1, further comprising: providing a reference test film including a first reference area and a second reference area adjacent to the first reference area; obtaining first and second reference jet values from first and second reference test patterns formed by jetting the chemical solution onto the first and second reference areas of the reference test film through the plurality of nozzles, respectively; and obtaining a first calibration value by calibrating the second reference jet value based on the first reference jet value.

6. The method of claim 5, wherein the jetting of the chemical solution onto the second substrate comprises jetting the chemical solution onto the second substrate based on the second jet value calibrated based on the first calibration value.

7. The method of claim 5, wherein the test film and the reference test film are the same single film substrate, and wherein the first and second areas and the first and second reference areas are coplanar with each other.

8. The method of claim 5, wherein the first and second reference areas on the reference test film are provided in areas corresponding to the first and second areas on the test film, respectively.

9. The method of claim 5, wherein each of the first and second reference areas has a width within a range of 5 mm to 15 mm.

10. The method of claim 5, wherein the jetting of the chemical solution onto the first substrate comprises calibrating a jet direction of each of the plurality of nozzles using the first jet value calibrated based on the first reference jet value to jet the chemical solution; and the jetting of the chemical solution onto the second substrate comprises calibrating the jet direction of each of the plurality of nozzles using the second jet value calibrated based on the first calibration value to jet the chemical solution onto the second substrate.

11. The method of claim 5, wherein the reference test film further comprises a third reference area adjacent to the second reference area, and the test film further comprises a third area adjacent to the second area.

12. The method of claim 11, further comprising: obtaining a third reference jet value from third reference test patterns formed by jetting the chemical solution through the plurality of nozzles onto the third reference area of the reference test film; and obtaining a second calibration value by calibrating the third reference jet value based on the first reference jet value.

13. The method of claim 12, further comprising: obtaining a third jet value from a third test pattern formed by jetting the chemical solution through the plurality of nozzles on the third area of the test film; and jetting the chemical solution onto a third substrate using the third jet value calibrated based on the second calibration value.

14. A method of processing a substrate, comprising:
obtaining a first jet value from a first test pattern formed by jetting a chemical solution through a plurality of nozzles onto the first area of the test film;
jetting the chemical solution onto a first substrate through calibrating a jet direction of the plurality of nozzles based on the first jet value;
obtaining a second jet value from a second test pattern formed by jetting the chemical solution through the plurality of nozzles onto a second area adjacent to the first area of the test film; and
jetting the chemical solution onto a second substrate through calibrating the jet direction of the plurality of nozzles based on the second jet value.

15. The method of claim 14, further comprising: obtaining first and second reference jet values from first and second reference test patterns formed by jetting the chemical solution onto first and second reference areas of the reference test film through the plurality of nozzles, respectively; and obtaining a first offset value of the first and second reference jet values.

16. The method of claim 15, wherein the jetting of the chemical solution onto the second substrate further comprises calibrating the jet direction of the plurality of nozzles based on the second jet value calibrated on a basis of the first offset value.

17. The method of claim 14, wherein the plurality of nozzles comprises first and second sets of jetting nozzles arranged along first and second lines, respectively, parallel to each other.

18. The method of claim 17, wherein the first and second sets of jetting nozzles jet the chemical solution in a line on the first and second reference areas and on the first and second areas, respectively.

19. The method of claim 14, wherein each of the first and second areas has a width within a range of 5 mm to 15 mm.

20. A method of processing a substrate, comprising:
providing a first test film including first to third reference areas;
obtaining first to third reference jet values from first to third reference test patterns formed by jetting a chemical solution through a plurality of nozzles onto the first to third reference areas of the first test film, respectively;
calibrating the second and third reference jet values based on the first reference jet value to obtain first and second calibration values, respectively;
providing a second test film including first to third areas;
obtaining a first jet value from a first test pattern formed by jetting the chemical solution through the plurality of nozzles onto the first area of the second test film;
jetting the chemical solution onto a first substrate through calibrating a jet direction of each of the plurality of nozzles using the first jet value calibrated based on the first reference jet value;
obtaining a second jet value from a second test pattern formed by jetting the chemical solution through the plurality of nozzles onto the second area of the second test film;
jetting the chemical solution onto a second substrate through calibrating the jet direction of each of the plurality of nozzles using the second jet value calibrated based on the first calibration value;
obtaining a third jet value from a third test pattern formed by jetting the chemical solution through the plurality of nozzles onto the third area of the second test film; and
jetting the chemical solution onto a third substrate through calibrating the jet direction of each of the plurality of nozzles using the third jet value calibrated based on the second calibration value.

* * * * *